Feb. 19, 1963 A. WHARTON 3,077,658

METHOD OF MANUFACTURING MOLDED MODULE ASSEMBLIES

Filed April 11, 1960 3 Sheets-Sheet 1

INVENTOR.
ARMISTEAD WHARTON
BY
Robert L. Mathews
ATTORNEY

Feb. 19, 1963 A. WHARTON 3,077,658

METHOD OF MANUFACTURING MOLDED MODULE ASSEMBLIES

Filed April 11, 1960 3 Sheets-Sheet 2

Feb. 19, 1963 A. WHARTON 3,077,658

METHOD OF MANUFACTURING MOLDED MODULE ASSEMBLIES

Filed April 11, 1960 3 Sheets-Sheet 3

MODULE PORTION
AFTER GRINDING

COMPLETE
MODULE ASSEMBLY 3,077,658

METHOD OF MANUFACTURING MOLDED MODULE ASSEMBLIES

Armistead Wharton, Rochester, N.Y., assignor to General Dynamics Corporation, Rochester, N.Y., a corporation of Delaware Filed Apr. 11, 1960, Ser. No. 21,178
2 Claims. (Cl. 29—155.5)

The present invention relates to the process of manufacturing molded module assemblies for supporting electrical circuits.

In recent years, printed circuit cards have been resorted to for supporting the components of an electronic circuit and for providing the electrical connections between these components. The fabrication of circuitry in this manner involves expensive drilling or perforating of holes for receiving component leads. In addition, the automatic insertion of component leads into these holes by machine has been found to be impractical, except on very large volume repetitive production. Modules which envelop and support electronic circuitry also have been developed and occupy considerably less volume than printed circuit cards. However, the cost of electronic circuits in module form has been equal or greater than the cost of circuitry mounted on the conventional printed circuit cards.

Accordingly, it is a principal object of the present invention to provide an improved method of manufacturing module assemblies for supporting electronic circuitry utilizing standard components.

It is a further object of the present invention to provide a method of manufacturing module assemblies which are relatively inexpensive compared to conventional printed circuit card assemblies and which occupy approximately one-seventh of the volume of the printed circuit cards.

It is a still further object of the present invention to provide an improved method of manufacturing module assemblies which does not involve expensive drilling or countersinking operations for forming the holes for passing the components leads to the surfaces of the module, and the funnels for guiding the leads into the holes where the components are automatically inserted into the module.

Other objects, features, and advantages of this invention will become apparent to those skilled in the art by referring to specific steps described in the following specification and shown in the accompanying drawings in which:

FIGS. 1–5 disclose the various steps in the process of manufacturing a molded module assembly.

Figure 1:
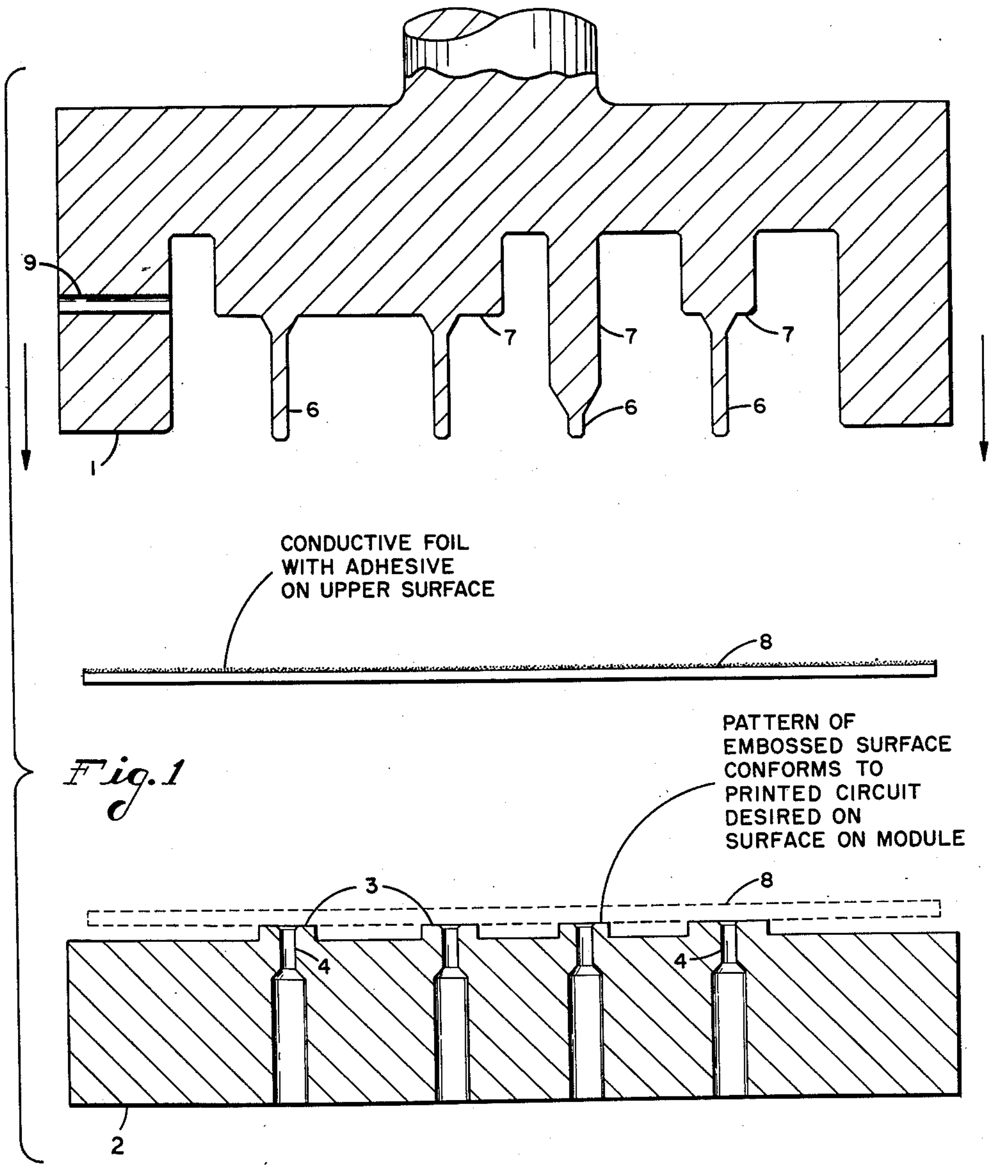

FIG. 1 of the drawings discloses an open mold having an upper portion 1 which mates with a lower base portion 2 having embossed areas 3 formed upon its upper surface. The pattern of these embossed areas will depend upon the desired printed circuit which is to be formed integrally with the molded module. Cylindrical holes 4 are drilled through the base portion 2 of the mold to accommodate the pins 6 which are integral with the upper portion 1 of the mold. Various protuberances 7 are disclosed which will form the cavities for supporting the various electronic components within the module. A conductive foil 8 is inserted between the upper and lower portions of the mold, as shown. The conductive foil could be made of copper with a suitable adhesive coating on its upper surface.

Figure 2:
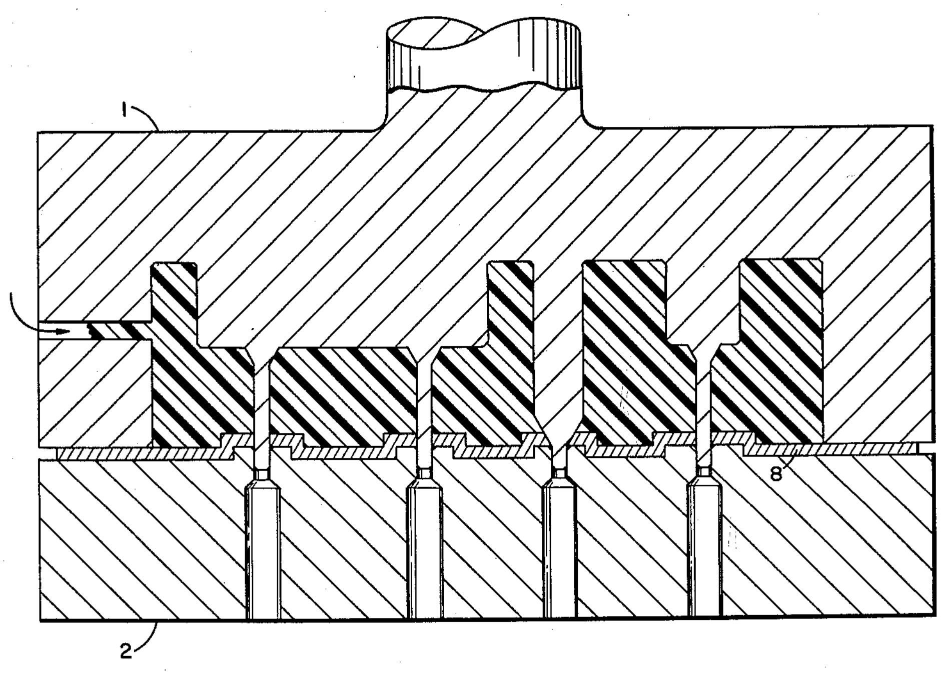

The upper portion of the mold mates with the lower portion so that the pins 6 pass through the cylindrical holes 4 while piercing the conductive foil. After the upper portion 1 of the mold is seated on the base portion 2 and the pins 6 are in place, a fusible substance, such as plastic, is introduced through port 9 by a ram or other conventional means. Good results were attained by the use of "Orlon"-filled diallyl-phthalate or glass-filled diallyl-phthalate. The former material had the best molding properties and no trouble was experienced in the dip soldering process, to be mentioned hereinafter. However, it should be understood that the practice of the invention is in no way limited by the use of any particular fusible material. The plastic is forced through port 9 under considerable pressure so that the conductive foil 8 is made to conform to the upper surface of the base portion 2 of the mold as shown in FIG. 2. A pressure of two thousand pounds per square inch, which is normal for most plastic molding processes, gave satisfactory results. After the plastic solidifies, the portions of the mold are separated and the module is removed. The module portion at this stage of the process is shown in FIG. 3.

Figure 3:
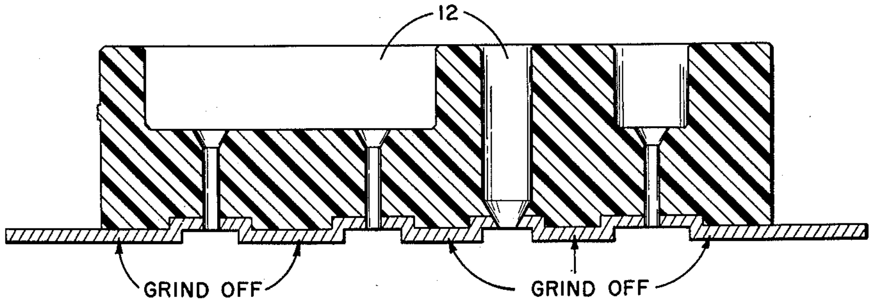
Figure 4:
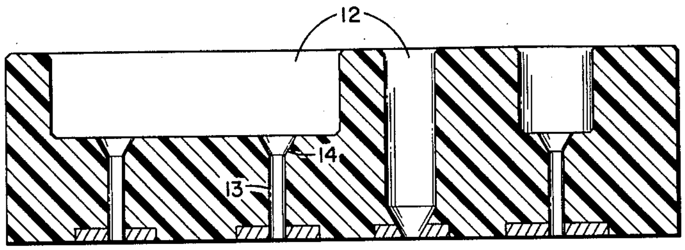
Figure 5:
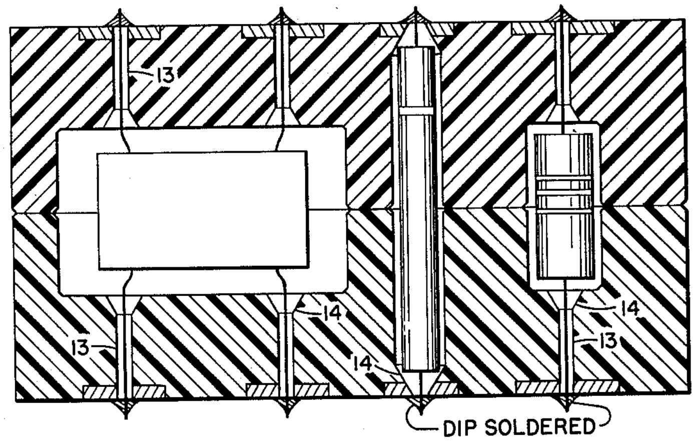

The adhesive applied to the upper surface of the conductive foil causes the foil to adhere to the lower surface of the module portion as shown in FIG. 3. The protruding portions of the lower surface are ground off or otherwise removed. A surface grinder would be practical for mass production. FIG. 4 discloses the module portion as it appears after grinding. The printed circuit, taking the shape of the embossed surface of the base portion 2 of the mold, is inlaid in the plastic module portion. It should be noted that the pin holes which are formed by pins 6 pass completely through the module portion and the printed circuit inlaid in the module. The various components may be inserted into the cavities 12 either by hand, or automatically by means of conventional devices. A second module portion similar to the first module portion is then positioned as shown in FIG. 5. The funnel-shaped orifices 14 of FIG. 5, which are automatically formed during the molding process, guide the component leads into the holes where automatic insertion of components is desirable. The printed circuitry of the upper portion of the fully assembled module will, in most cases, differ from the printed circuitry of the lower portion. The leads of the components are passed through the holes 13 and are soldered directly to the printed circuit.

The two portions of the module may be designed with sections which interlock or key together to assure proper alignment. These sections may be cemented together during assembly, or the entire module may be dipped or cast in a suitable plastic material to provide additional protection and hermetic sealing of the circuitry and components. Depending upon the requirements, the multiplicity of soldered joints in the face of each module portion may be sufficient to withstand any stress existing between the two portions, without recourse to other strengthening means.

In summary, the present invention provides for the automatic assembly of a module containing standard size components. It should be apparent that the steps are of such a nature that manual assembly may be totally eliminated, in contrast with the fabrication of conventional printed circuits.

While there has been disclosed what is at present considered to be the preferred steps of carrying out the invention, other modifications will readily occur to those skilled in the art. It is not, therefore, desired that the invention be limited to the specific steps shown and described and it is intended in the appended claims to cover all such modifications as fall within the true spirit and scope of the invention.

What is claimed is:

1. The process for manufacturing a molded module section comprising the steps of providing first and second mating die portions where said first die portion includes one or more protruding portions which mate with one or more holes formed in said second die portion when said first and second die portions are brought together and where said second die portion includes an embossed surface having a raised pattern which corresponds to the printed circuit pattern to be formed on the surface of the molded module section, placing a conductive foil between said first and second die portions, closing the die so that said protruding portions of said first die portion mate with said holes of said second die portion to pierce said foil, introducing an insulating molding compound into said die at a relatively high pressure so that said conductive foil is made to substantially conform to the embossed surface of said second die portion and cavities are produced within the solidifying module section by said protruding portions, separating said first and second die portions, withdrawing the molded module section from the mold, and removing the raised portions of the surface of said module section formed by the embossed surface of said second die portion.

2. The combination set forth in claim 1 wherein an adhesive substance is placed on the surface of said conductive foil which is exposed to said insulating molding compound after the die is closed.

References Cited in the file of this patent

UNITED STATES PATENTS

| | | |
|---|---|---|
| 304,252 | Beher | Aug. 26, 1884 |
| 1,589,913 | Wells | June 22, 1926 |
| 2,022,364 | Walsh et al. | Nov. 26, 1935 |
| 2,431,393 | Franklin | Nov. 25, 1947 |
| 2,613,252 | Heibel | Oct. 7, 1952 |
| 2,692,190 | Pritikin | Oct. 19, 1954 |
| 2,700,719 | Coler et al. | Jan. 25, 1955 |
| 2,774,052 | Flour | Dec. 11, 1956 |
| 2,862,992 | Franz | Dec. 2, 1958 |
| 2,902,628 | Leno | Sept. 1, 1959 |
| 2,912,746 | Oshry et al. | Nov. 17, 1959 |
| 2,994,806 | McLaughlin | Aug. 1, 1961 |

OTHER REFERENCES

Swiggett: Introduction to Printed Circuits, John F. Rider Publisher, Inc. New York (1956). (Pages 65, and 69–71 relied on.)